(12) United States Patent
Su et al.

(10) Patent No.: US 12,641,779 B2
(45) Date of Patent: May 26, 2026

(54) MEMORY DEVICE AND METHOD OF FORMING THE SAME

(71) Applicant: Winbond Electronics Corp., Taichung City (TW)

(72) Inventors: Yuan-Hao Su, Taichung City (TW); Chun-Chieh Wang, Taichung City (TW); Tzu-Ming Ou Yang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 427 days.

(21) Appl. No.: 18/316,240

(22) Filed: May 12, 2023

(65) Prior Publication Data

US 2023/0389300 A1 Nov. 30, 2023

(30) Foreign Application Priority Data

May 25, 2022 (TW) .................................... 111119395

(51) Int. Cl.
H10B 12/00 (2023.01)
(52) U.S. Cl.
CPC ........... H10B 12/485 (2023.02); H10B 12/02 (2023.02); H10B 12/482 (2023.02); H10B 12/488 (2023.02)

(58) Field of Classification Search
CPC .... H10B 12/485; H10B 12/02; H10B 12/482; H10B 12/488; H10B 12/315; H10B 12/0335
See application file for complete search history.

(56) References Cited

U.S. PATENT DOCUMENTS

2021/0242214 A1 8/2021 Chang et al.
2022/0115377 A1* 4/2022 Kim ..................... H10D 64/513

* cited by examiner

*Primary Examiner* — Mohammed R Alam
(74) *Attorney, Agent, or Firm* — JCIPRNET

(57) ABSTRACT

Provided is a memory device and a method of forming the same. The method includes: providing a substrate having multiple active regions; forming a first layer stack on the substrate; patterning the first layer stack to form multiple recesses in the first layer stack; forming a liner layer on the first layer stack to cover the recesses; performing an etching process to remove a portion of the liner layer and the first layer stack below the recesses, so as to extend the recesses downward to form multiple openings, wherein the openings respectively expose the active regions; respectively forming multiple conductive structures in the openings; forming a second layer stack on the conductive structures; and patterning the second layer stack and the conductive structures to form multiple bit-line structures and bit-line contacts, respectively.

12 Claims, 22 Drawing Sheets

— 101

— 202

— AA(100)

— A

— 124

120        120        124

Y

X 14          14

106a
104
102

101

AA(100)

MEMORY DEVICE AND METHOD OF FORMING THE SAME

CROSS-REFERENCE TO RELATED APPLICATION

This application claims the priority benefit of Taiwan application serial no. 111119395, filed on May 25, 2022. The entirety of the above-mentioned patent application is hereby incorporated by reference herein and made a part of this specification.

BACKGROUND

Technical Field

The disclosure relates generally to contacts and method of manufacturing the same, and more specifically, to a memory device having special bit-line contacts and a method of forming the same.

Description of Related Art

A dynamic random access memory (DRAM) is a volatile memory, which includes a memory array formed by multiple memory cells. Specifically, each of the memory cells includes a transistor and a capacitor controlled by the transistor, and the memory cells are selected through word lines and bit lines. In order to improve the integration of DRAM to increase the operating speed of the device and to meet the consumers' demand for miniaturization of electronic devices, DRAM with buried word lines has been developed in recent years for the aforementioned purposes.

With advancement of technology, electronic products are developed to have design features of lightness, slimness, shortness and smallness. In this case, the critical dimension of DRAM is also reduced, which results in many challenges in the manufacturing process of DRAM. For example, when defining the bit-line structure, the Si residue will remain at the corner between the active region and the bit-line contact, resulting in a short circuit between the bit-line contact and the capacitor contact.

SUMMARY

The disclosure provides a memory device and a method of forming the same, which may prevent a short circuit between a bit-line contact and a capacitor contact.

The disclosure provides a method of forming a memory device, including the following steps. A substrate having multiple active regions is provided. A first layer stack is formed on the substrate. The first layer stack is patterned to form multiple recesses in the first layer stack. A liner layer is formed on the first layer stack to cover the recesses. An etching process is performed to remove a portion of the liner layer and the first layer stack below the recesses, so as to extend the recesses downward to form multiple openings, and the openings respectively expose the active regions. Multiple conductive structures are respectively formed in the openings. A second layer stack is formed on the conductive structures. The second layer stack and the conductive structures are patterned to form multiple bit-line structures and a plurality of bit-line contacts, respectively.

The disclosure provides a memory device, including a substrate having multiple active regions, multiple bit-line structures disposed in parallel on the substrate along a Y direction, and multiple bit-line contacts respectively disposed at an overlap of the bit-line structures and the active regions and electrically connecting the bit-line structures and the active regions. Each of the bit-line contacts has a concave sidewall along the Y direction, and an included angle between the concave sidewall and a bottom surface of the bit-line contact is an acute angle.

According to the memory device and the method of forming the same provided by the disclosure, a bottom material of the bit-line contact may be effectively removed when the bit-line contact is defined, so as to prevent the short circuit between the bit-line contact and the capacitor contact, thereby improving reliability of memory device.

DETAILED DESCRIPTION OF DISCLOSED EMBODIMENTS

Figure 1A:
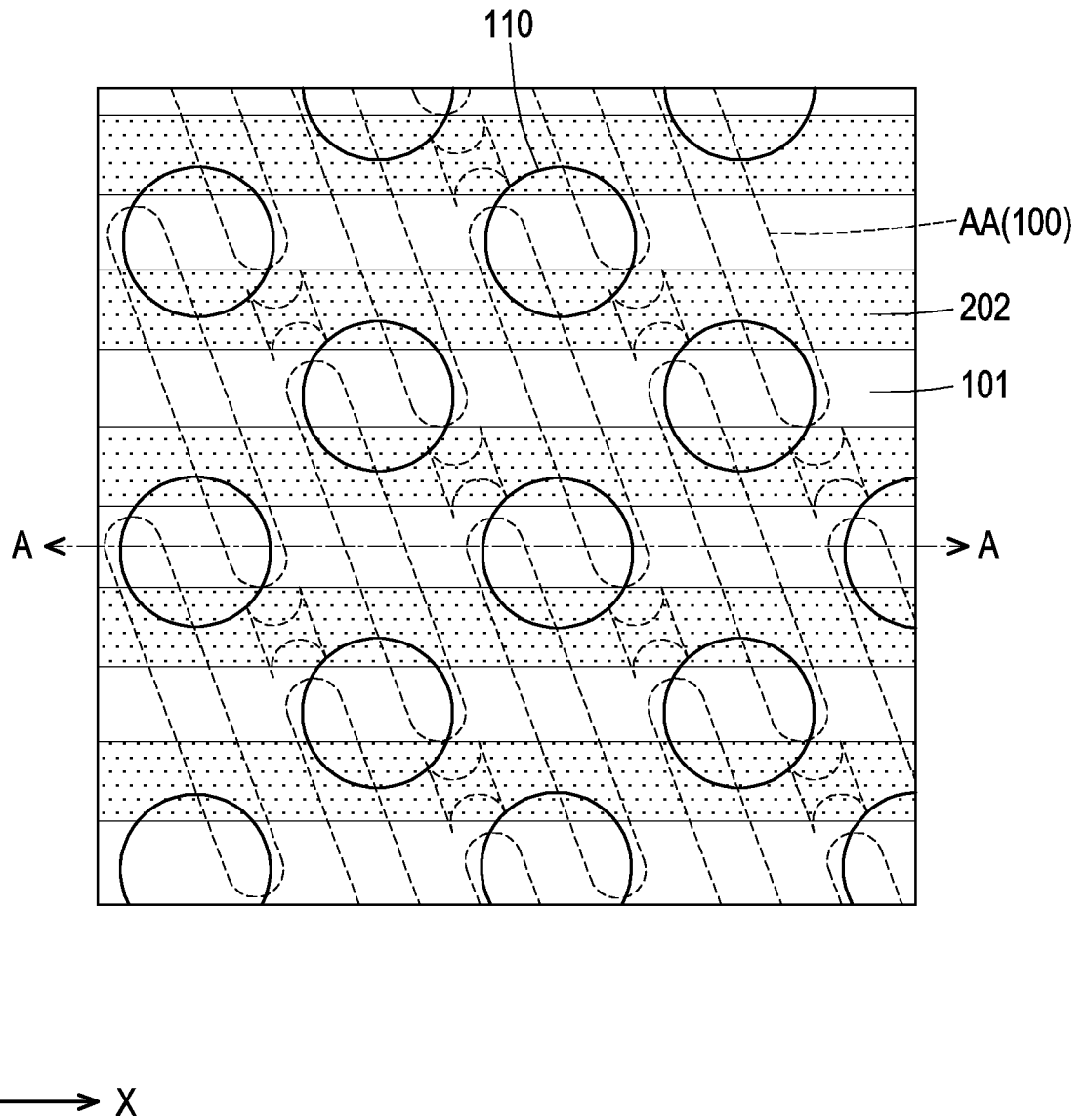
FIGS. 1A to 1J are schematic top views of a manufacturing process of a memory device according to an embodiment of the disclosure.
Figure 1B:
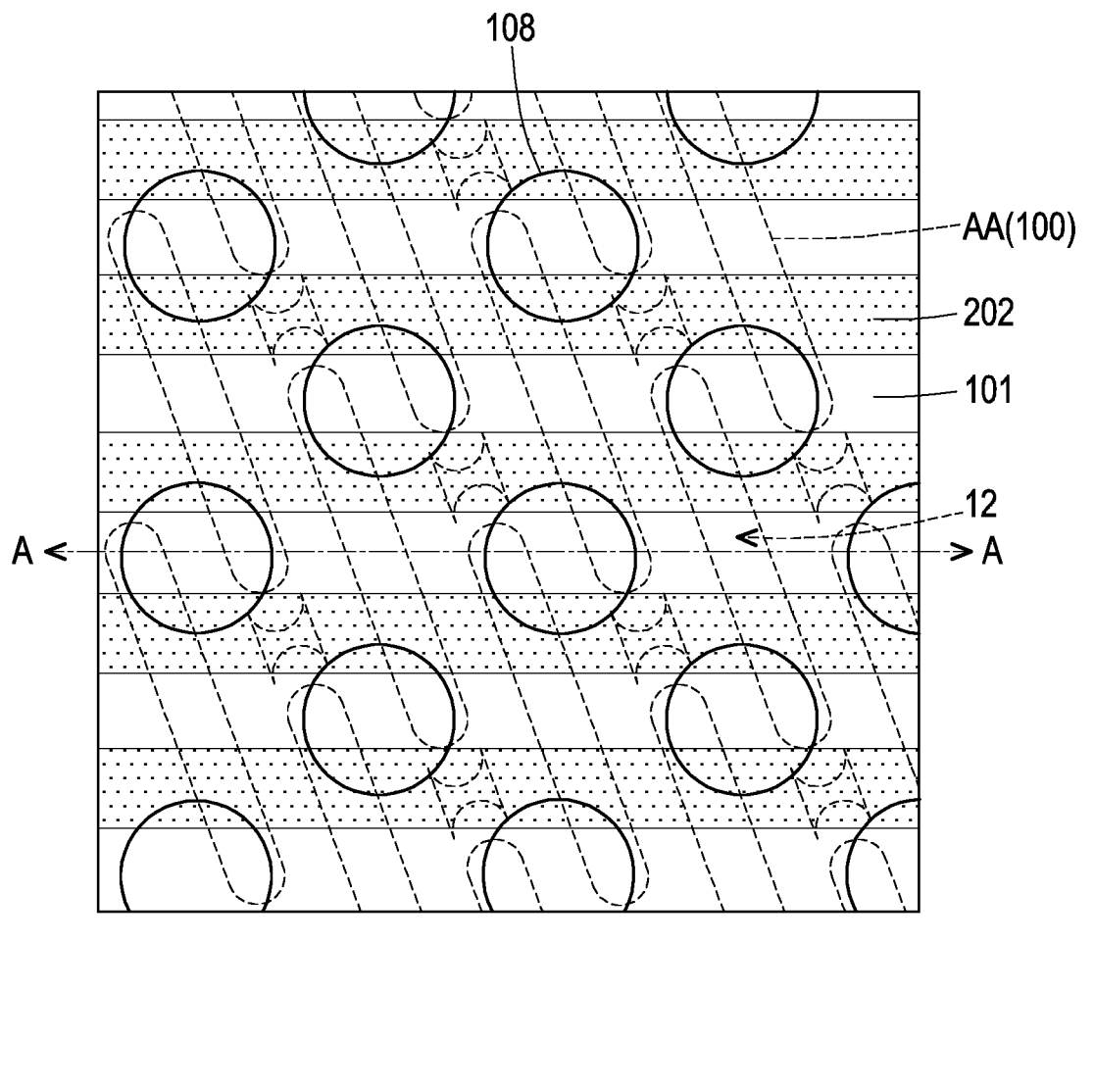

The present disclosure will now be described more fully with reference to the accompanying drawings. However, the disclosure can be embodied in various forms, and is not limited to the embodiments provided below. The same reference numbers are used in the drawings and the description to refer to the same or like parts, and description of the same parts are not repeated in following paragraphs. The memory device in the following embodiments is described by taking a dynamic random access memory (DRAM) as an example, but the disclosure is not limited thereto.

In this embodiment, a method of forming a memory device is provided, which includes the following steps. First, referring to FIGS. 1A and 2A, a first layer stack S1 and a photoresist pattern 110 are sequentially formed on a substrate 100. In an embodiment, the substrate 100 may be, for example, a semiconductor substrate, a semiconductor compound substrate, or a semiconductor substrate (SOI) on an insulating layer. In this embodiment, the substrate 100 is a silicon substrate.

Figure 2A:
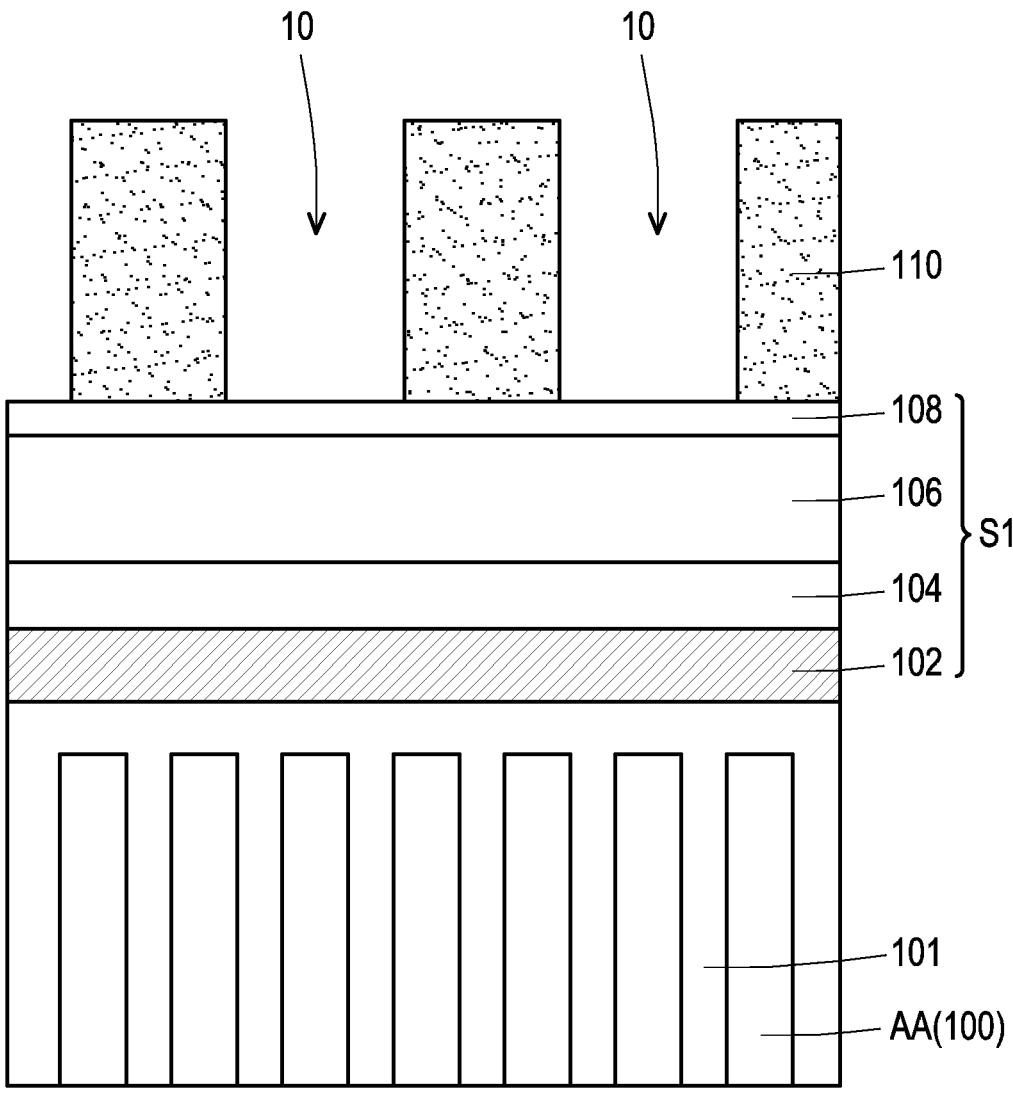
FIGS. 2A to 2J are schematic cross-sectional views of the manufacturing process of the memory device taken along a line A-A of FIGS. 1A to 1J, respectively.
Figure 2B:
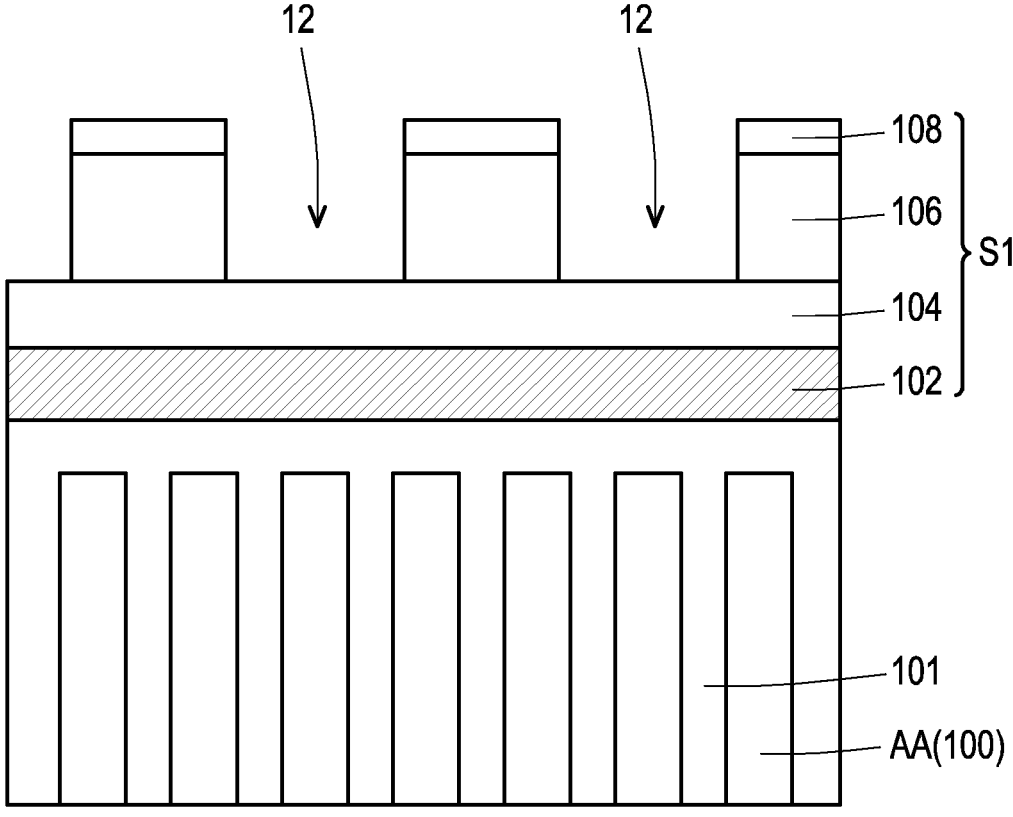
Figure 2C:
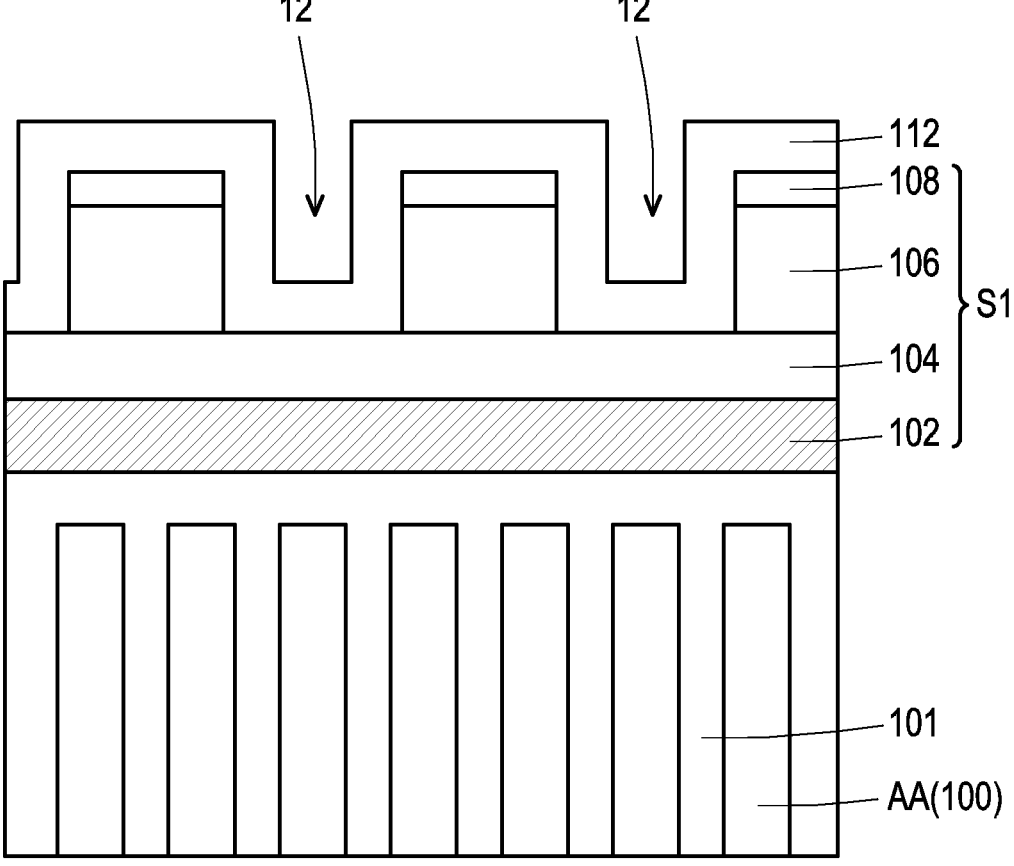

As shown in FIG. 2A, the substrate 100 has multiple isolation structures 101 to separate the substrate 100 into multiple active regions AA. In an embodiment, the isolation structures 101 include a dielectric material, such as silicon oxide, silicon nitride, or a combination thereof. In addition, the isolation structures 101 may be a single-layer structure or a multi-layer structure. For example, the isolation structures 101 may include a first isolation layer and a second isolation layer for separating the first isolation layer and the substrate 100. The first isolation layer may be a silicon nitride layer, and the second isolation layer may be a thermal oxide layer. In an alternative embodiment, the isolation structures 101 may be, for example, a shallow trench isolation structure (STI).

In an embodiment, the first layer stack S1 includes a conductive material layer 102, an oxide layer 104, a carbon-containing material layer 106, and a dielectric layer 108 that are sequentially formed. The conductive material layer 102 may be a doped or undoped polysilicon layer. The oxide layer 104 may be a tetraethoxysilane (TEOS) layer. The carbon-containing material layer 106 may be a diamond-like carbon layer, an amorphous carbon film, or a combination thereof. The dielectric layer 108 may be a silicon oxynitride layer. In addition, there may be a dielectric layer between the first layer stack S1 and the substrate 100, such as a pad oxide layer, to separate the active regions AA and the conductive material layer 102 above.

The photoresist pattern 110 may have multiple openings 10 to expose a top surface of the first layer stack S1. The opening 10 may correspond to a position of a subsequently formed bit-line contact 124 (shown in FIG. 2J). In an embodiment, a material of the photoresist pattern 110 includes a positive photoresist, a negative photoresist, etc., which may be formed by a spin coating method and a developing process.

In addition, as shown in FIG. 1A, before the first layer stack S1 is formed, the method further includes the following. Multiple buried word lines 202 are formed in the substrate 100. Each of the buried word lines 202 may extend along an X direction (i.e., a second direction), and the buried word lines 202 may be arranged along a Y direction (i.e., a first direction). The buried word lines 202 may penetrate through the active regions AA and the isolation structures 101.

Referring to FIGS. 1A to 1B and 2A to 2B, the first layer stack S1 is patterned to form multiple recesses 12 in the first layer stack S1. Specifically, the photoresist pattern 110 is used as a mask, and the dielectric layer 108 and the carbon-containing material layer 106 below the openings 10 are removed, thereby exposing a top surface of the oxide layer 104.

Figure 1C:
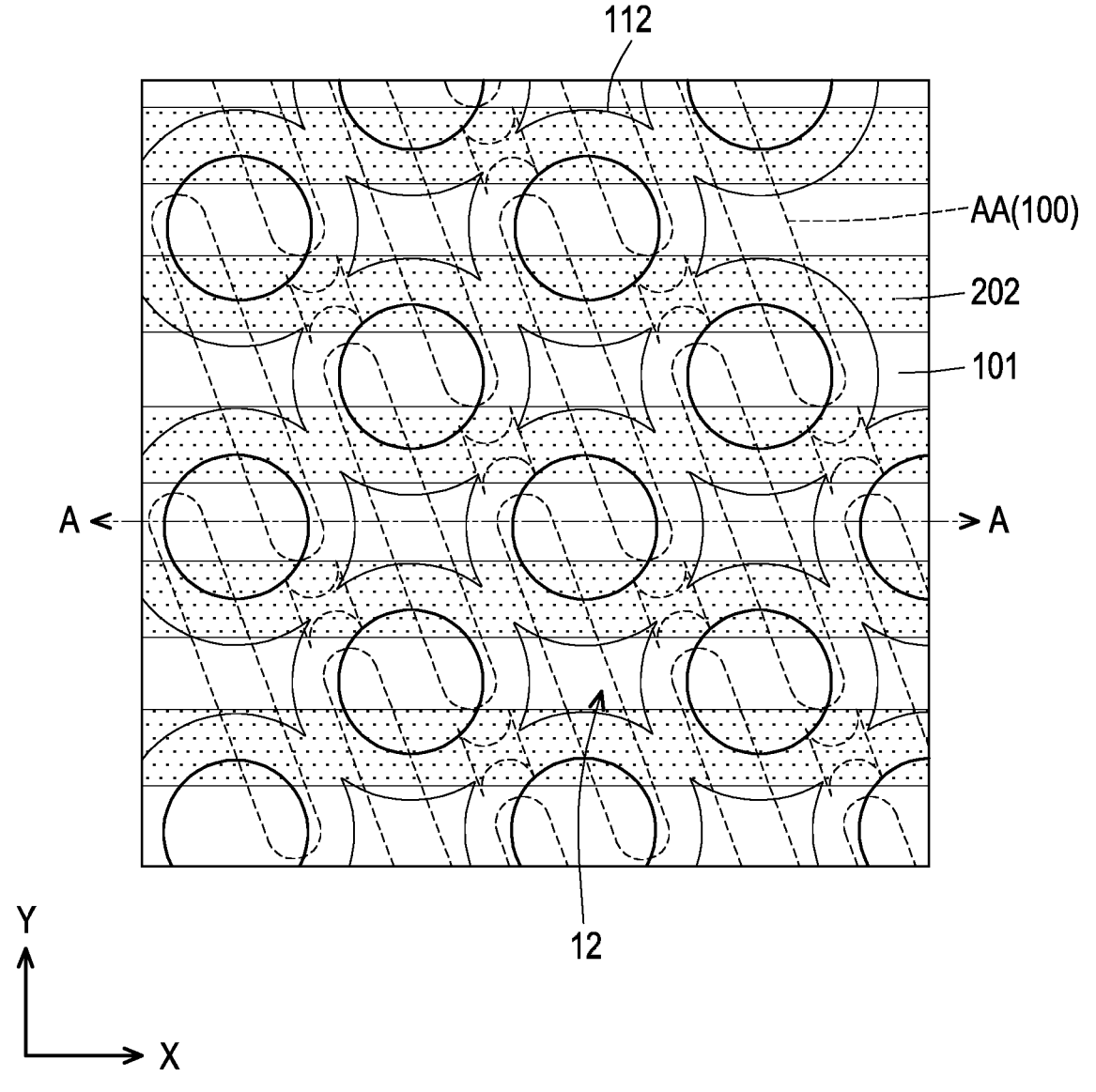
Figure 1D:
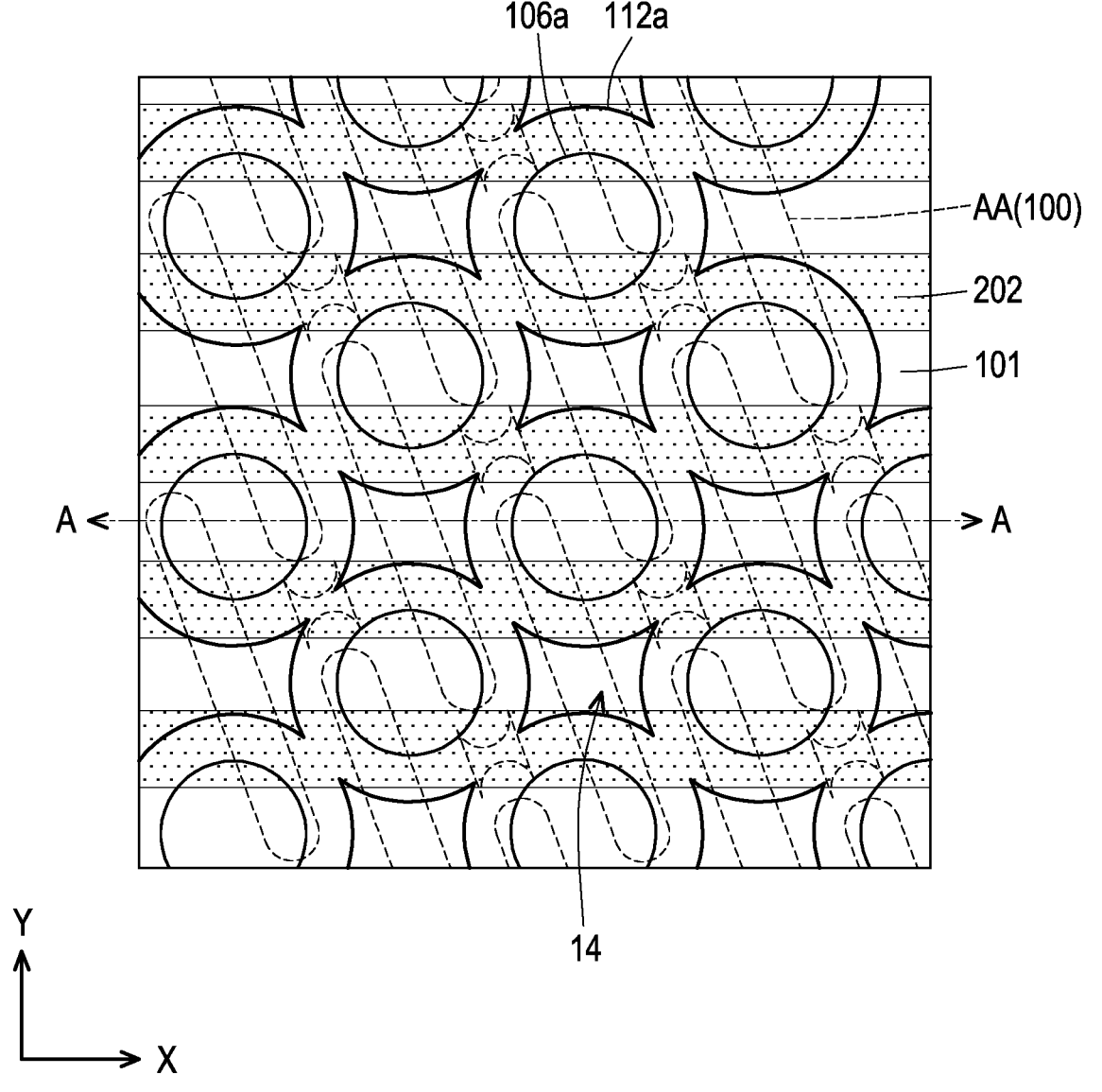
Figure 1E:
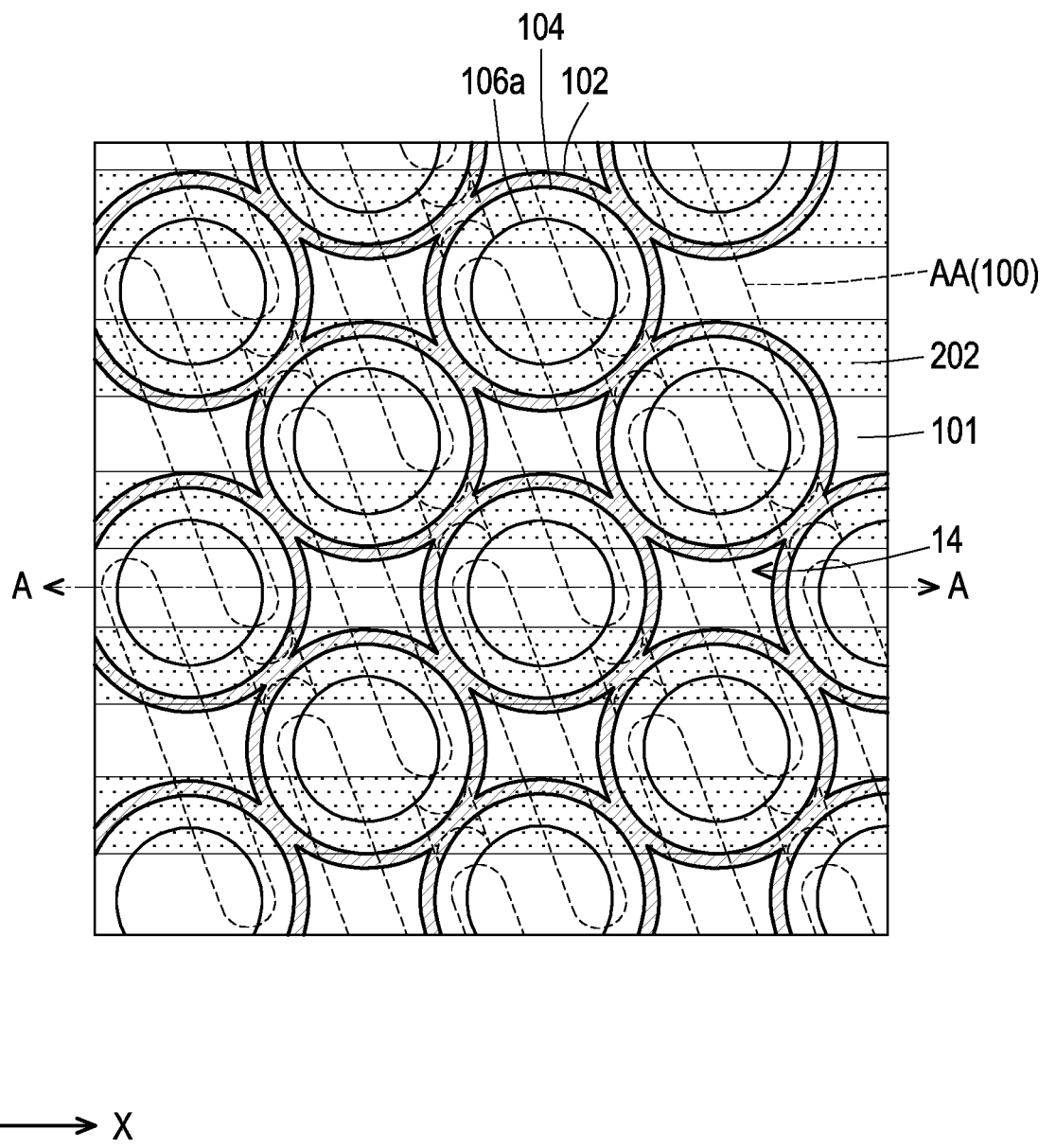
Figure 1F:
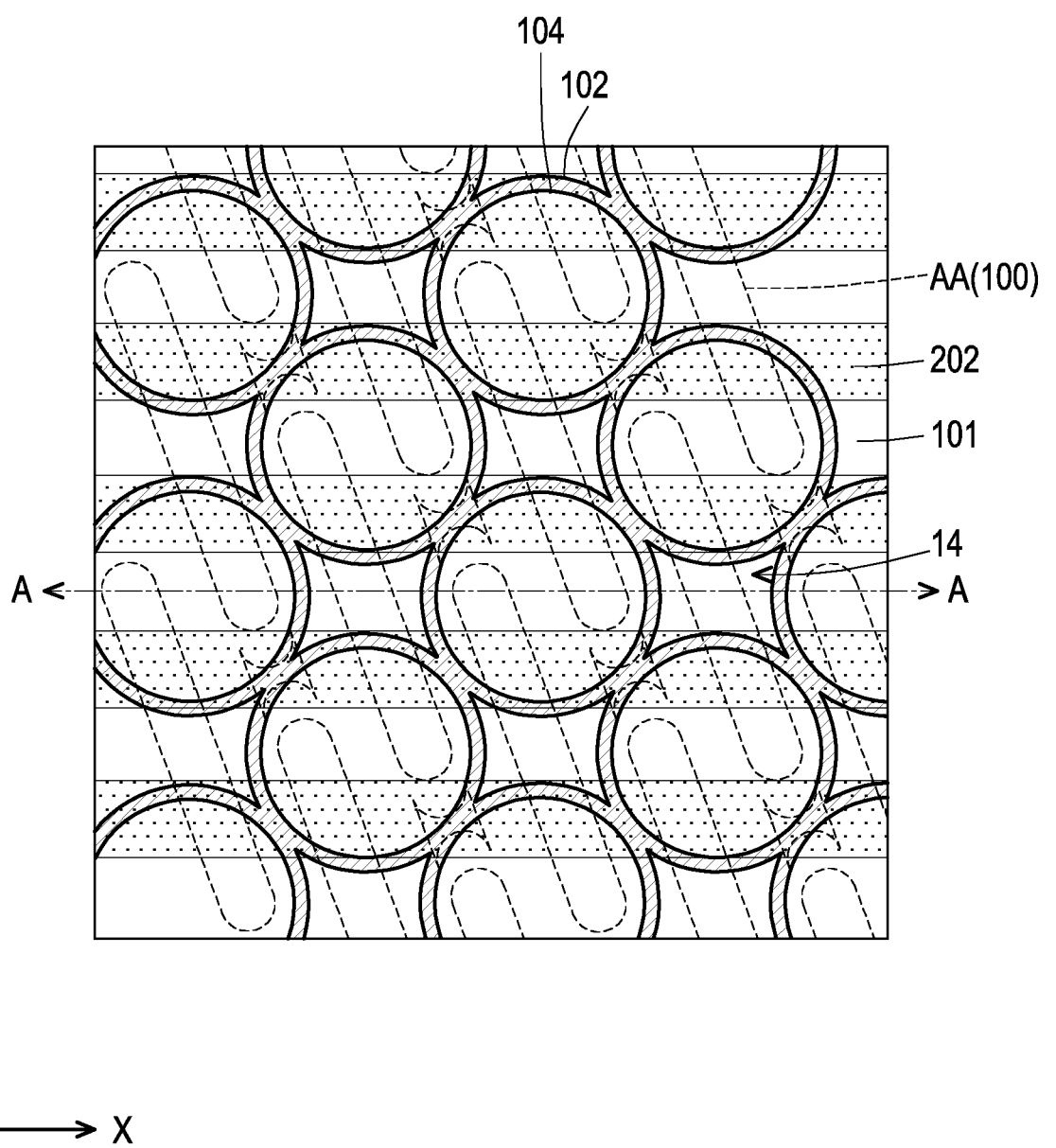
Figure 1G:
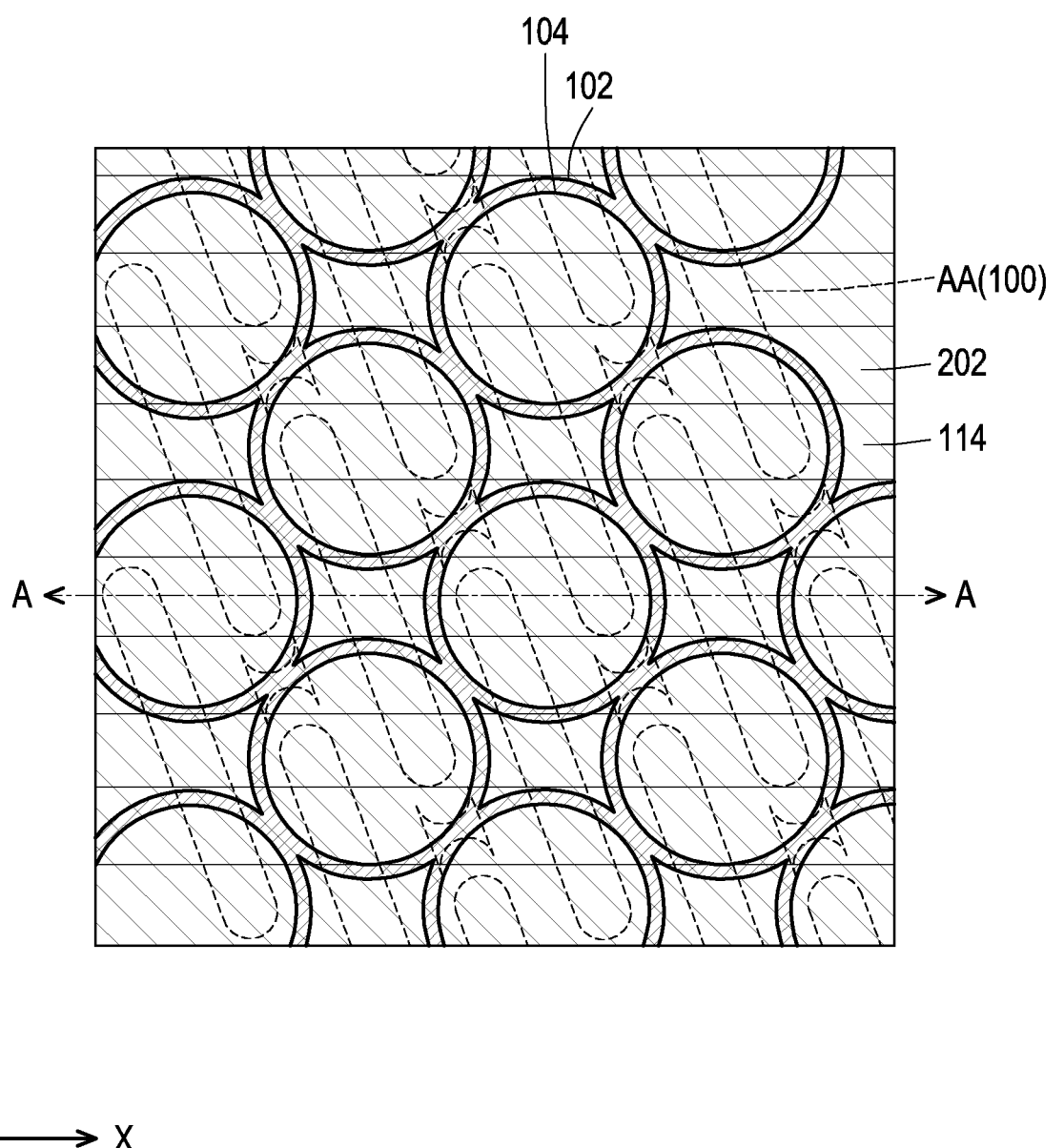
Figure 2D:
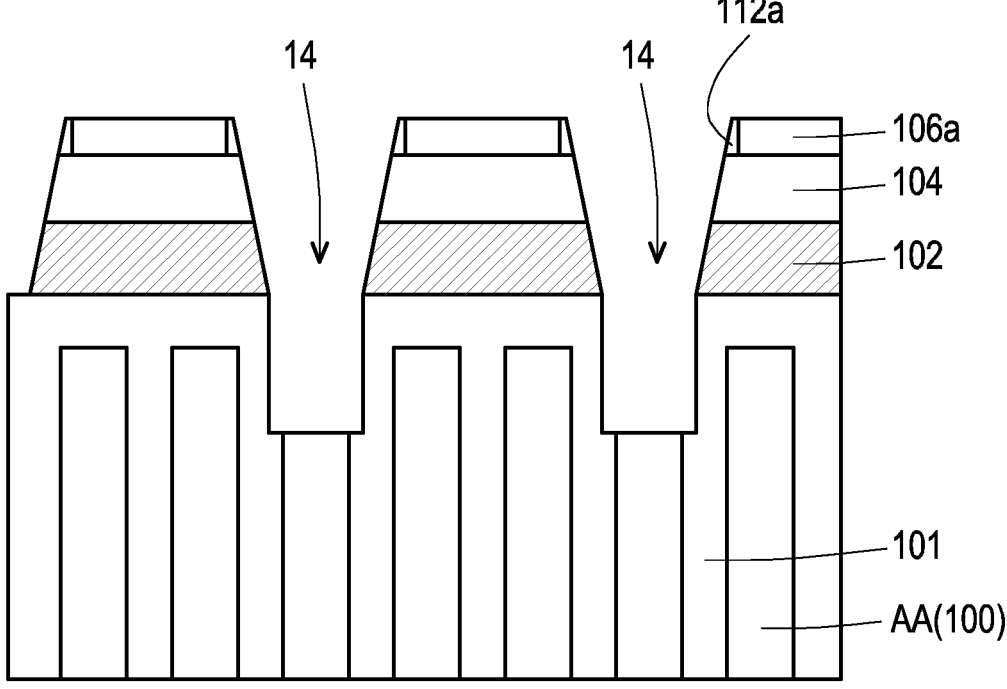

Referring to FIGS. 1C and 2D, a liner layer 112 is conformally formed on the first layer stack S1 to cover surfaces of the recesses 12 and the dielectric layer 108. In an embodiment, a material of the liner layer 112 includes oxide, which may be formed by an atomic layer deposition (ALD) method. Therefore, the liner layer 112 may also be referred to as an ALD oxide layer.

Referring to FIGS. 1C to 1D and 2C to 2D, an etching process is performed to remove a portion of the liner layer 112 and the first layer stack S1 below the recesses 12, so as to extend the recesses 12 downward to form multiple openings 14. As shown in FIG. 2D, the openings 14 may extend into the substrate 100 and expose the active regions AA. The opening 14 may correspond to the position of the subsequently formed bit-line contact 124. In an embodiment, the etching process may be an anisotropic etching process, such as reactive ion etching (RIE). In the etching process, the openings 14 aligned with the active regions AA may be formed without the mask. Therefore, the openings 14 may also be referred to as self-aligned openings. It is worth noting that as shown in the top view, FIG. 1D, the openings 14 are formed between four circular gaps. Therefore, the openings 14 may have irregular geometric shapes, such as a four-pointed star. However, the disclosure is not limited thereto. In other embodiments, the openings 14 may have other irregular geometric shapes, such as a three-pointed star, a pentagram shape, and the like. In addition, after the etching process, the dielectric layer 108 may be completely removed, while a remaining liner layer 112a is formed as a spacer on a sidewall of a carbon-containing material layer 106a.

Figure 2E:
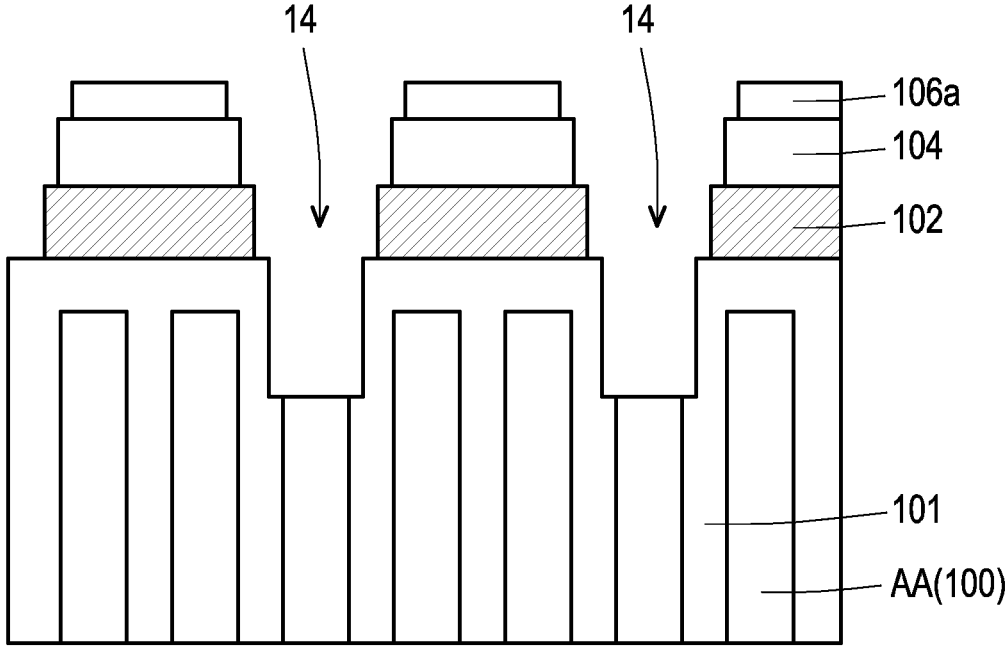
Figure 2F:
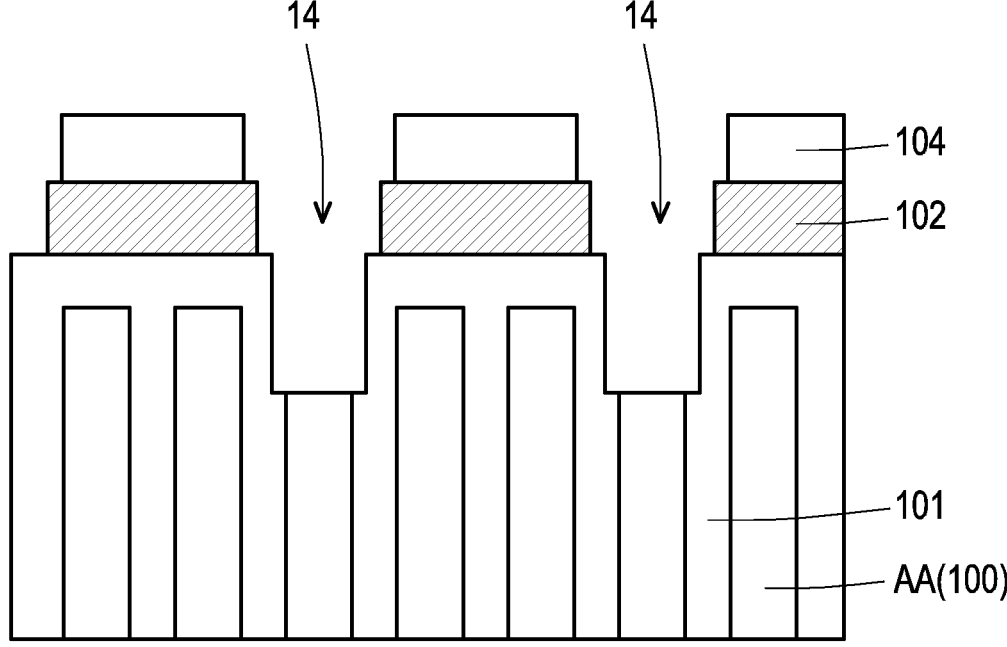

Referring to FIGS. 1D to 1F and 2D to 2F, a wet etching process is performed to remove the remaining liner layer 112a. As shown in FIG. 2E, the openings 14 may be formed as openings that are wide at the top and narrow at the bottom. In addition, although the openings 14 shown in FIG. 2E have stepped sidewalls, the disclosure is not limited thereto. In other embodiments, the openings 14 may also have smooth sidewalls. After the liner layer 112a is removed, the carbon-containing material layer 106a is removed to expose the top surface of the oxide layer 104, as shown in FIG. 2F.

Figure 1H:
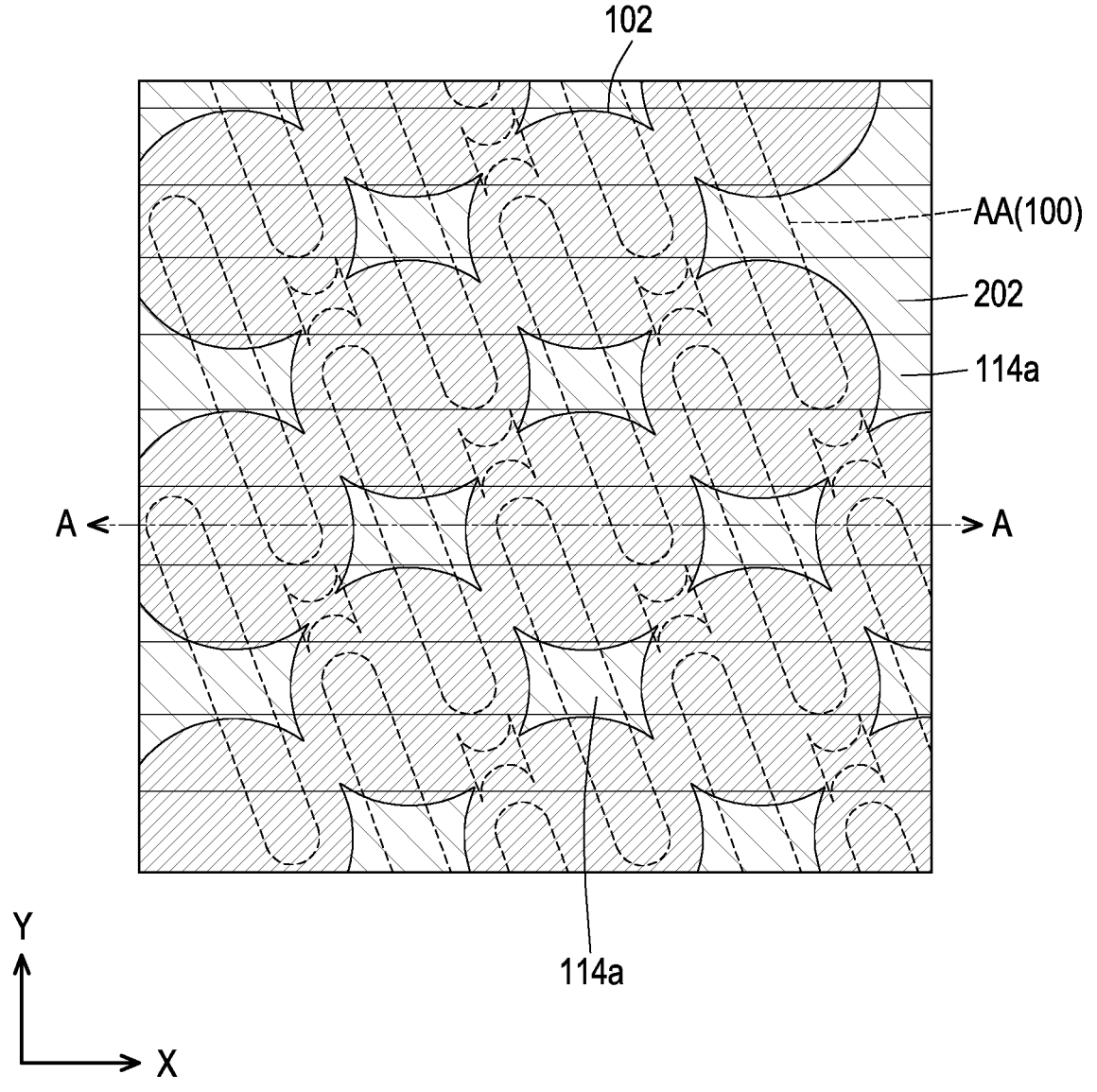
Figure 1I:
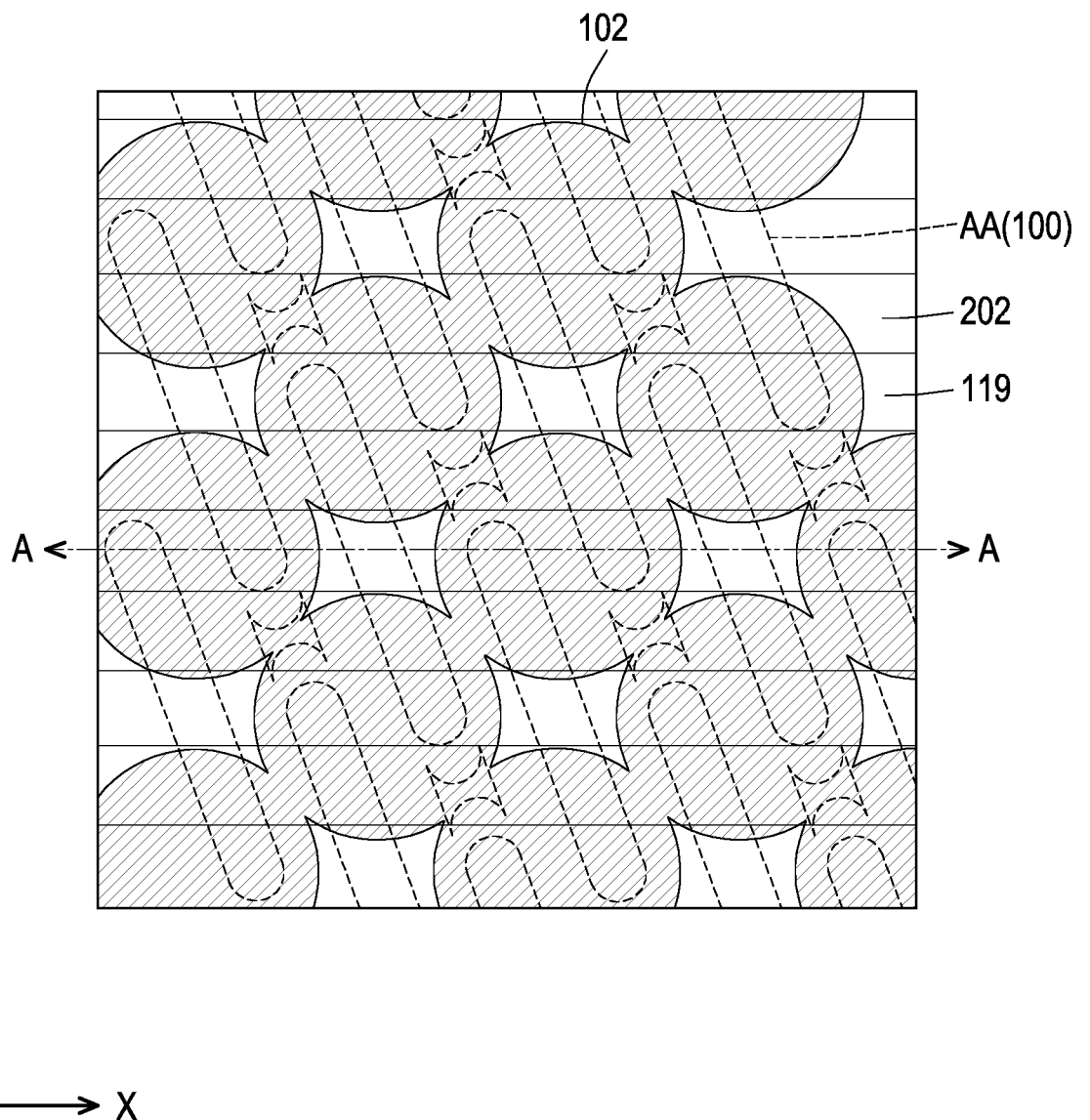
Figure 2G:
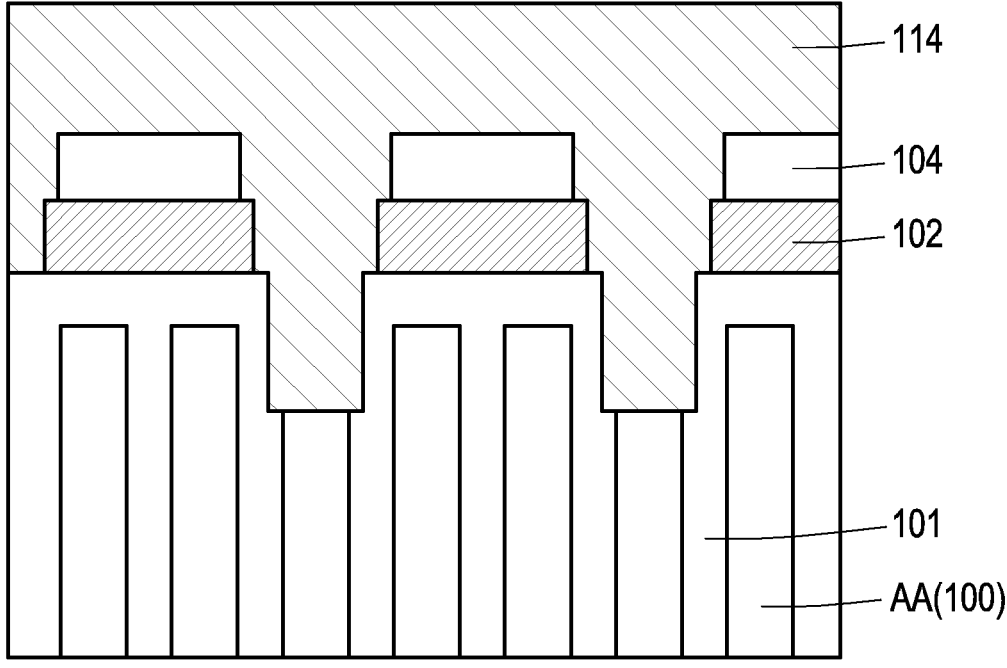
Figure 2H:
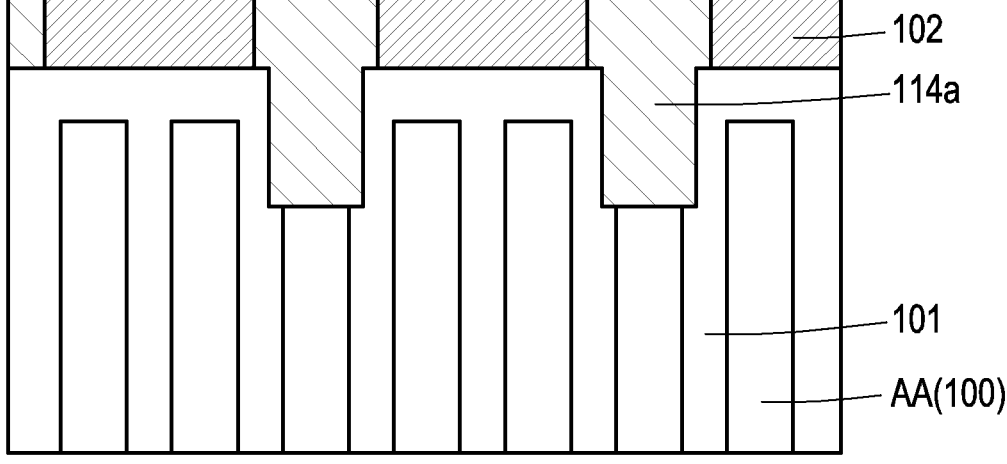
Figure 2I:
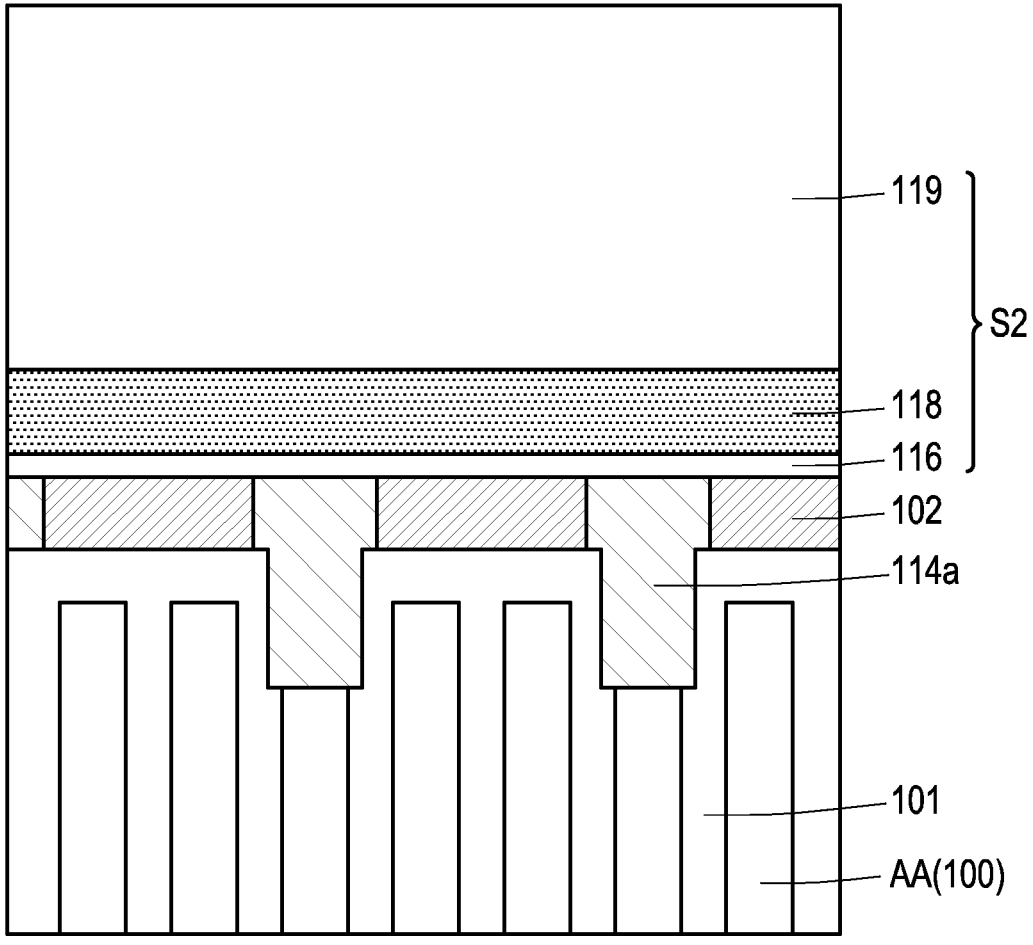

Referring to FIGS. 1F to 1H and 2F to 2H, multiple conductive structures 114a are respectively formed in the openings 14. Specifically, a conductive material 114 is formed to fill in the openings 14 and extend to cover the top surface of the oxide layer 104, as shown in FIG. 2G. In an embodiment, the conductive material 114 includes a doped or undoped polysilicon material. Then, a planarization process (e.g., a CMP process) is performed to remove a portion of the conductive material 114 and the oxide layer 104, so as to expose a top surface of the conductive material layer 102. As shown in FIG. 2H, the top surface of the conductive material layer 102 may be flush with a top surface of the conductive structure 114a.

Figure 3A:
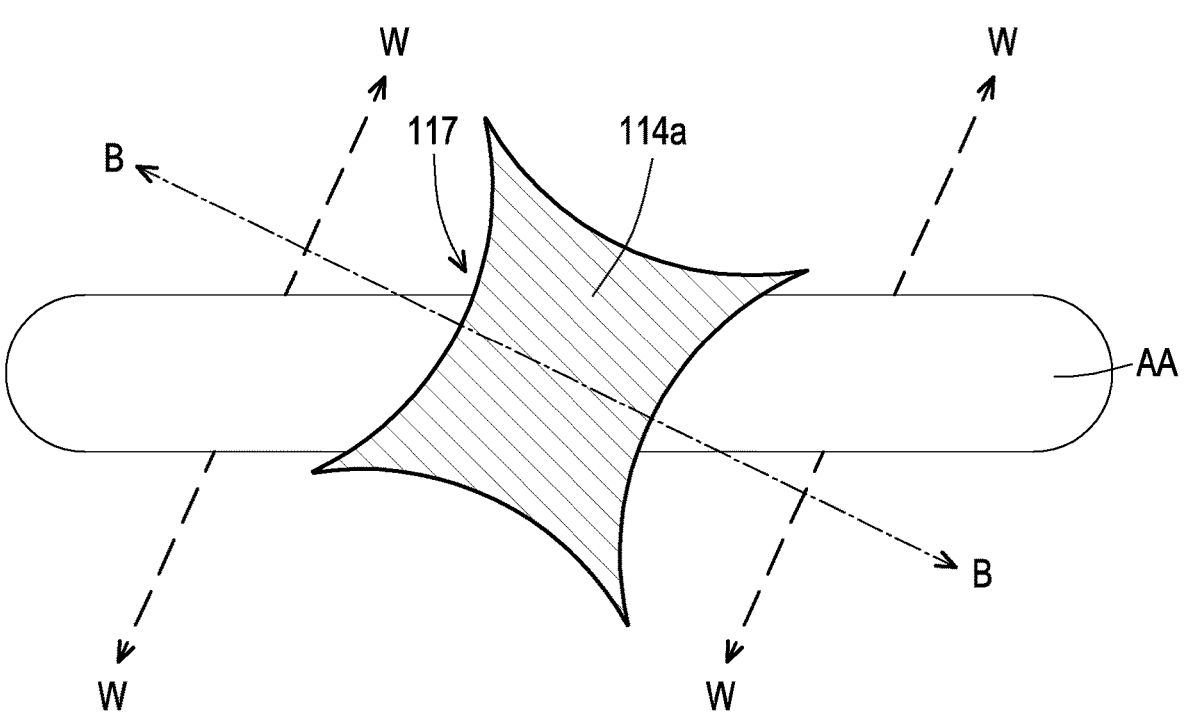
FIG. 3A is a schematic top view of a conductive structure according to an embodiment of the disclosure.
Figure 3B:
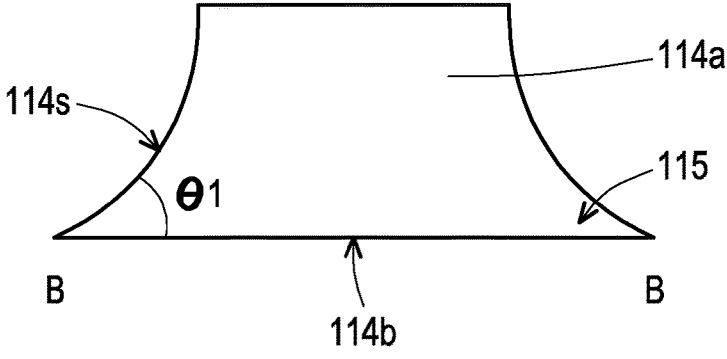
FIG. 3B is a schematic cross-sectional view of the conductive structure taken along a line B-B of FIG. 3A.

It is worth noting that as shown in the top view, FIG. 1H, since the conductive structures 114a are formed by filling in the openings 14, the conductive structures 114a also have irregular geometric shapes, such as the four-pointed star. In detail, as shown in FIG. 3A, a line B-B is taken along an extension direction of a subsequently formed bit-line structure 120 (shown in FIG. 1J), and a line W-W is taken along an extension direction of the buried word line 202 (shown in FIG. 1H). The conductive structure 114a may be formed between the two adjacent buried word lines, and formed at an overlap of the bit-line structure and the active region AA. In this embodiment, the conductive structure 114a is shaped like the four-pointed star in the top view, and a sidewall of the four-pointed star is recessed from the outside to the inside. In addition, as shown in FIG. 3B, the conductive structure 114a has a rectangular cross-sectional shape taken along the line B-B, and has a concave sidewall 114s that is recessed toward a center of the conductive structure 114a. In an embodiment, an included angle θ1 between the concave sidewall 114s and a bottom surface 114b of the conductive structure 114a is an acute angle. That is to say, the conductive structure 114a has a skirt-like cross-sectional structure 115 taken along the line B-B. That is, along the extension direction of the subsequently formed bit-line structure 120, a width of a bottom of the conductive structure 114a is greater than a width of a top of the conductive structure 114a. By forming the skirt-like cross-sectional structure 115 in this embodiment, the unnecessary conductive structures 114a are removed during subsequent definition of the bit-line structure, and no Si residue remains at a corner 117 between the active region AA and the subsequently formed bit-line structure 120.

Referring to FIGS. 1I to 1J and 2I to 2J, a second layer stack S2 is formed on the conductive structures 114 and the conductive material layer 102. In an embodiment, the second layer stack S2 includes a barrier material layer 116, a metal material layer 118, and a capping material layer 119 sequentially from bottom to top. A material of the barrier material layer 116 includes a barrier metal material, such as Ti, TiN, Ta, TaN, or a combination thereof. A material of the metal material layer 118 includes a metal material, such as W. A material of the capping material layer 119 includes a dielectric material, such as silicon nitride. Next, the second layer stack S2 and the conductive structures 114a are patterned to form the bit-line structures 120.

Figure 1J:
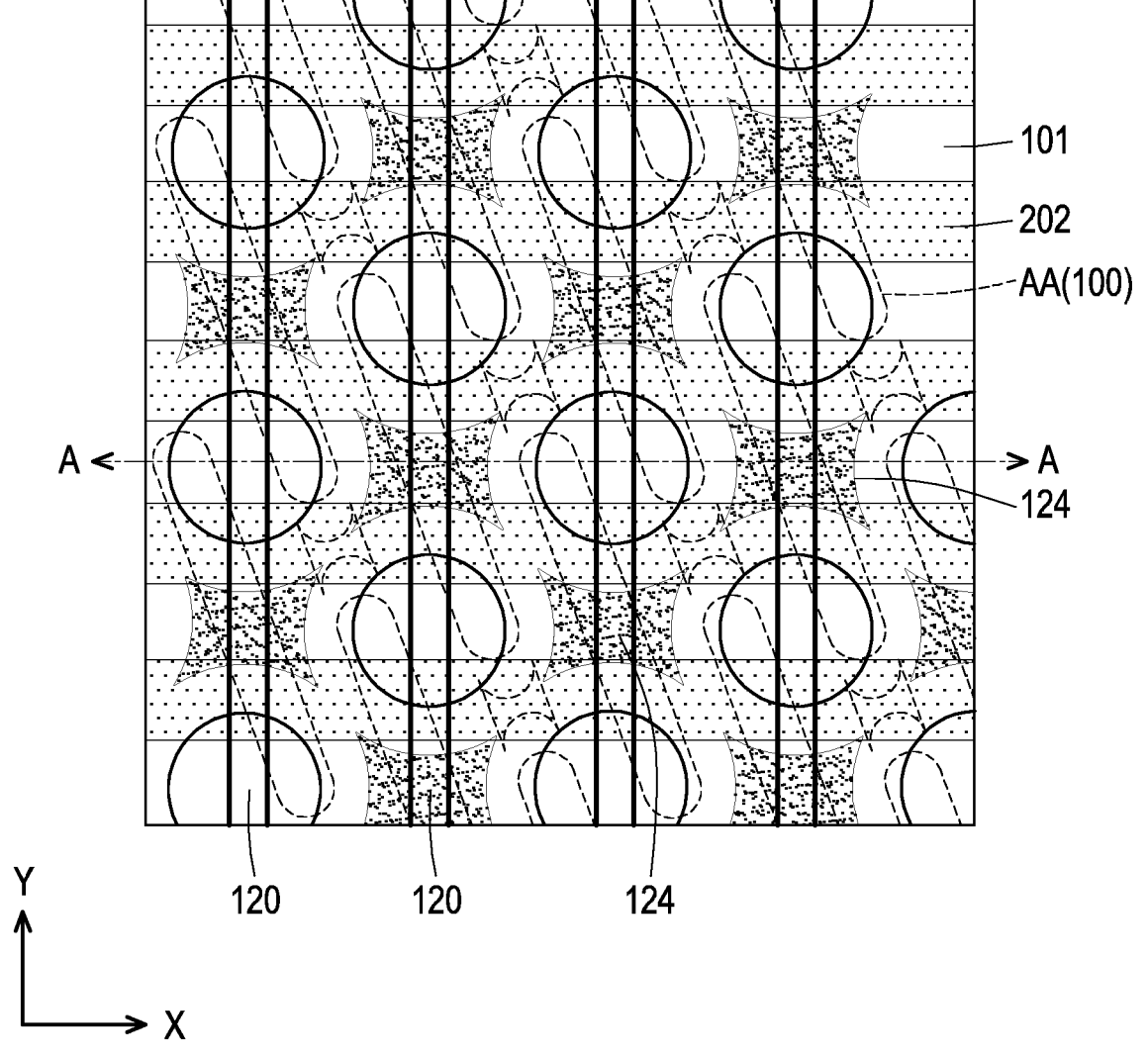
Figure 2J:
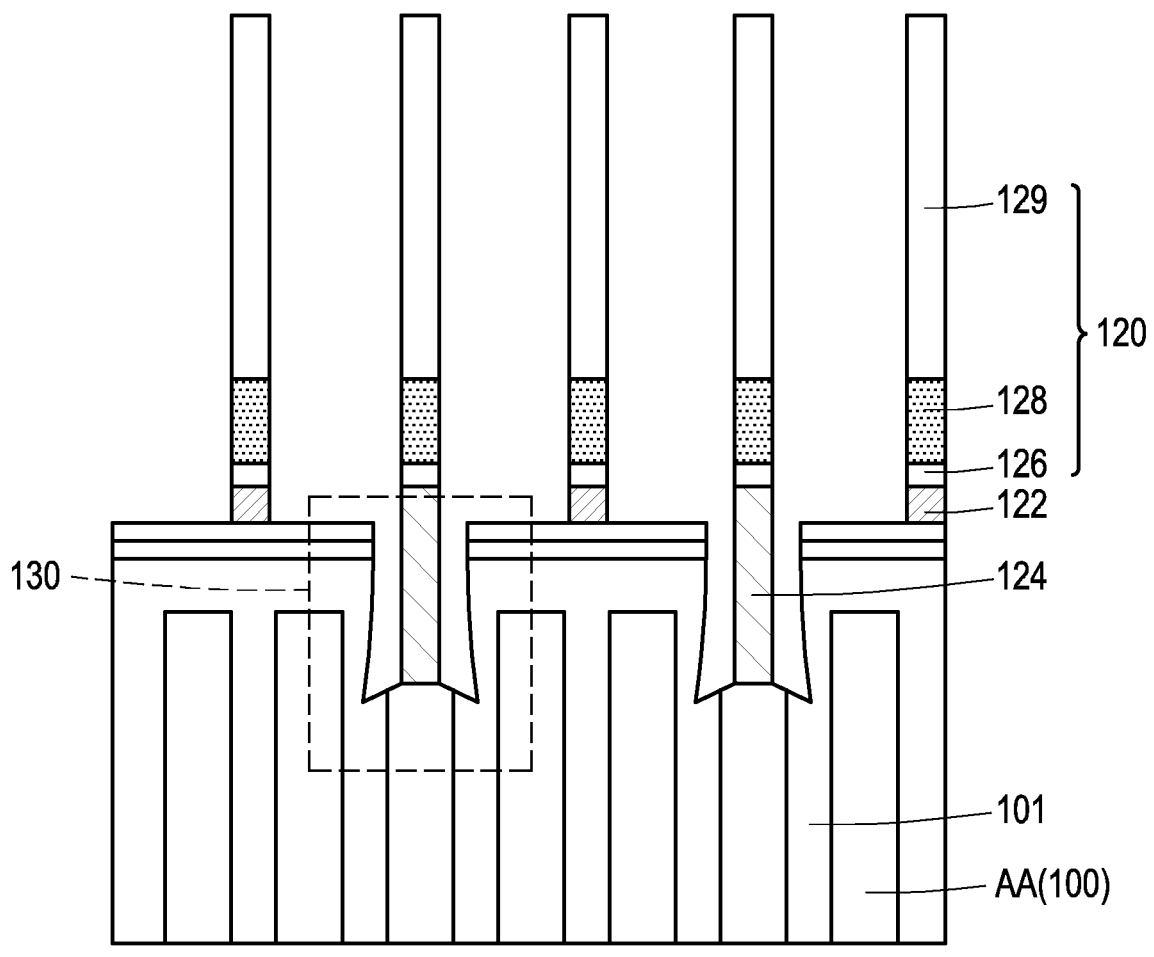

In an embodiment, the bit-line structure 120 includes a conductive layer 122, a barrier layer 126, a metal layer 128, and a cap layer 129 sequentially from bottom to top. As shown in FIG. 1J, each of the bit-line structures 120 extends along the Y direction, and the bit-line structures 120 are arranged along the X direction. As shown in FIGS. 1J and 2J, the conductive structures 114a may be patterned to form the bit-line contacts 124, and the bit-line contact 124 may be disposed between the bit-line structure 120 and the active region AA to electrically connect the bit-line structure 120 and the active region AA.

After forming the bit-line structures 120, conventional methods for forming active region contact, capacitor contact and capacitor between adjacent bit-line structures 120 can be implemented, and other known elements of DRAM can be formed to complete the DRAM.

Figure 4:
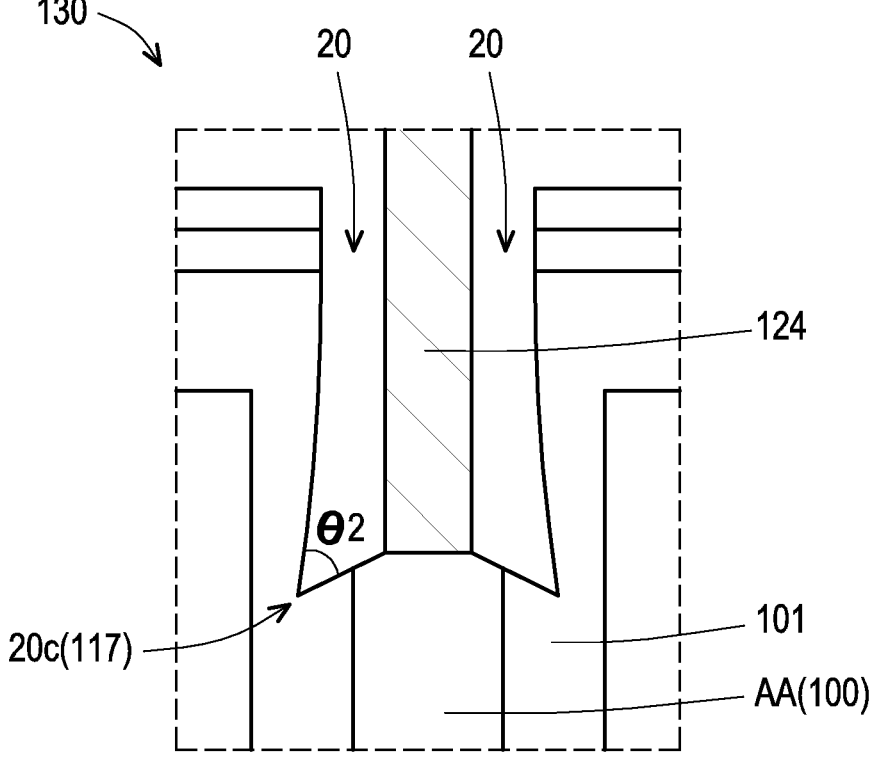
FIG. 4 is a schematic partial enlarged view of FIG. 2J.

It is worth noting that compared with an egg-shaped conductive structure of the conventional technology, the conductive structures 114a in this embodiment may have the skirt-like cross-sectional structure 115 (as shown in FIG. 3B). Therefore, when openings 20 extends downward into the substrate 100, a portion with a thinner thickness in the bottom (i.e., at the skirt-like cross-sectional structure 115) of the conductive structure 114a may be easily removed, and no Si residue remains at the corner 117 (FIG. 3A) between the active region AA and the bit-line structure 120. As shown in FIG. 4, the bit-line contact 124 has the skirt-like openings 20 on two sides. The skirt-like openings 20 may have a corner 20c facing away from the bit-line contact 124 without the Si residue in the corner 20c. In an embodiment, an included angle θ2 of the corner 20c is an acute angle.

Based on the above, in the method of forming the memory device in this embodiment, the conductive structures with the irregular geometric shapes may be formed by filling the conductive material in the self-aligned openings. The conductive structures may have the skirt-like cross-section structure, which is beneficial to remove the unnecessary bottom material of the conductive structures when subsequently defining the bit-line structure. Therefore, the Si residue will not remain at the corner between the active region and the bit-line structure to prevent a short circuit between the bit-line contact and the capacitor contact, thereby improving reliability of the memory device. According to the present invention, it is easier to realize the consumers' demand for miniaturization of the memory device. Therefore, the memory devices of the present disclosure may be used on space constrained applications including wearable, MP3 players, smart watches, games, digital radio, toys, cameras, digital photo album, GPS, Bluetooth and WiFi modules, but the invention is not limited thereto.

What is claimed is:

1. A method of forming a memory device, comprising:
providing a substrate having a plurality of active regions;
forming a first layer stack on the substrate;
patterning the first layer stack to form a plurality of recesses in the first layer stack;
conformally forming a liner layer on the first layer stack to cover the recesses;
performing an etching process to remove a portion of the liner layer and the first layer stack below the recesses, so as to extend the recesses downward to form a plurality of openings, wherein the openings respectively expose the active regions;

respectively forming a plurality of conductive structures in the openings;
forming a second layer stack on the conductive structures; and
patterning the second layer stack and the conductive structures to form a plurality of bit-line structures and a plurality of bit-line contacts, respectively.

2. The method of forming the memory device according to claim 1, wherein the first layer stack comprises, sequentially from bottom to top, a conductive material layer, an oxide layer, a carbon-containing material layer, and a dielectric layer.

3. The method of forming the memory device according to claim 2, wherein the recesses are formed in the carbon-containing material layer and the dielectric layer, and expose a top surface of the oxide layer.

4. The method of forming the memory device according to claim 2, wherein respectively forming the conductive structures in the openings comprises;
forming a conductive material to fill in the openings and extend to cover a top surface of the first layer stack; and
performing a planarization process to remove a portion of the conductive material and the oxide layer to expose a top surface of the conductive material layer.

5. The method of forming the memory device according to claim 1, wherein the liner layer comprises an oxide layer formed by an atomic layer deposition method.

6. The method of forming the memory device according to claim 1, wherein the second layer stack comprises, sequentially from bottom to top, a barrier material layer, a metal material layer, and a capping material layer.

7. The method of forming the memory device according to claim 1, wherein one of the bit-line structures comprises, sequentially from bottom to top, a conductive layer, a barrier layer, a metal layer, and a cap layer.

8. The method of forming the memory device according to claim 1, wherein after patterning the second layer stack and the conductive structures, the plurality of bit-line contacts are respectively formed at an overlap of the bit-line structures and the active regions.

9. The method of forming the memory device according to claim 1, wherein each of the plurality of bit-line contacts has skirt-like openings on two sides, and each of the skirt-like openings has a corner facing away from the bit-line contact.

10. The method of forming the memory device according to claim 1, wherein each of the bit-line contacts has a concave sidewall along an extension direction of the corresponding bit-line structure, and an included angle between the concave sidewall and a bottom surface of the bit-line contact is an acute angle.

11. The method of forming the memory device according to claim 1, wherein a shape of each of the conductive structures in a top view is a four-pointed star, and a sidewall of the four-pointed star is recessed from an outside to an inside.

12. The method of forming the memory device according to claim 1, wherein before forming the first layer stack on the substrate, the method further comprises: forming a plurality of buried word lines in the substrate, wherein the buried word lines and the bit-line structures are perpendicular to one another.

* * * * *